(12) United States Patent
Ohnishi

(10) Patent No.: US 8,004,041 B2
(45) Date of Patent: Aug. 23, 2011

(54) SEMICONDUCTOR DEVICE FOR SURGE PROTECTION

(75) Inventor: Kazuhiro Ohnishi, Osaka (JP)

(73) Assignee: Panasonic Corporation, Osaka (JP)

( * ) Notice: Subject to any disclaimer, the term of this patent is extended or adjusted under 35 U.S.C. 154(b) by 1019 days.

(21) Appl. No.: 11/574,052

(22) PCT Filed: Aug. 24, 2005

(86) PCT No.: PCT/JP2005/015334
§ 371 (c)(1),
(2), (4) Date: Feb. 21, 2007

(87) PCT Pub. No.: WO2006/022287
PCT Pub. Date: Mar. 2, 2006

(65) Prior Publication Data
US 2009/0034143 A1 Feb. 5, 2009

(30) Foreign Application Priority Data

Aug. 27, 2004 (JP) ................. 2004-248830

(51) Int. Cl.
H01L 23/62 (2006.01)
H01L 29/861 (2006.01)
H01L 31/107 (2006.01)
(52) U.S. Cl. ....................... 257/355; 257/605
(58) Field of Classification Search .......... 257/355, 257/605, E29.335, 329.332
See application file for complete search history.

(56) References Cited

U.S. PATENT DOCUMENTS

| | | | | |
|---|---|---|---|---|
| 5,905,282 A | * | 5/1999 | Sato et al. | 257/328 |
| 6,664,607 B2 | * | 12/2003 | Yoshitake | 257/545 |
| 6,791,123 B2 | * | 9/2004 | Yamagishi et al. | 257/174 |
| 7,190,006 B2 | * | 3/2007 | Ducreux | 257/109 |
| 2001/0050374 A1 | | 12/2001 | Yoshitake | |
| 2003/0071676 A1 | | 4/2003 | Yamagishi et al. | |

FOREIGN PATENT DOCUMENTS

| JP | 61-12085 | | 1/1968 |
|---|---|---|---|
| JP | 59-205768 | | 11/1984 |
| JP | 61-26267 | | 2/1986 |
| JP | 61026267 A | * | 2/1986 |
| JP | 2000-156509 | | 6/2000 |
| JP | 2001-352079 | | 12/2001 |
| JP | 2003-110119 | | 4/2003 |

* cited by examiner

*Primary Examiner* — Cuong Q Nguyen
(74) *Attorney, Agent, or Firm* — Hamre, Schumann, Mueller & Larson, P.C.

(57) ABSTRACT

A semiconductor device for surge protection having high surge resistance is provided. A semiconductor substrate (10) included in the semiconductor device for surge protection according to the present invention includes a high concentration first conductivity type semiconductor substrate (1), a low concentration first conductivity type semiconductor layer (2), a high concentration first conductivity type semiconductor layer (4), a second conductivity type semiconductor layer (3), and a cylindrical low concentration second conductivity type semiconductor layer (5) that extends from a surface of the low concentration first conductivity type semiconductor layer (2) into the low concentration first conductivity type semiconductor layer (2) so as to share an axis with the high concentration first conductivity type semiconductor layer (4), and has an interface (J4) with the high concentration first conductivity type semiconductor layer (4) and an interface (J5) with the second conductivity type semiconductor layer (3). Further, the low concentration second conductivity type semiconductor layer (5) has an impurity concentration lower than an impurity concentration of the second conductivity type semiconductor layer (3).

2 Claims, 2 Drawing Sheets

SEMICONDUCTOR DEVICE FOR SURGE PROTECTION

TECHNICAL FIELD

The present invention relates to a semiconductor device for surge protection.

BACKGROUND ART

Conventionally, a semiconductor device for surge protection using a constant voltage diode is known. In such a semiconductor device for surge protection, when a surge voltage (overvoltage) as high as a breakdown voltage of a constant voltage diode is applied, for protection of an apparatus, a surge current (overcurrent) that flows due to the surge voltage is caused to flow in a ground direction by the constant voltage diode (see, for example, Patent Document 1).

FIG. 4 is a cross-sectional view of a conventional semiconductor device for surge protection proposed in Patent Document 1 described above. As shown in FIG. 4, the semiconductor device for surge protection includes a semiconductor substrate 100. The semiconductor substrate 100 includes a high concentration n-type semiconductor substrate 110, a low concentration n-type semiconductor layer 111 that is formed on the high concentration n-type semiconductor substrate 110, a p-type semiconductor layer 112 that extends from a surface of and into the low concentration n-type semiconductor layer 111, and a high concentration n-type semiconductor layer 113 that extends from a surface of and into the p-type semiconductor layer 112. Further, an insulating film 116 is formed so as to cover the surface of the low concentration n-type semiconductor layer 111, the surface of the p-type semiconductor layer 112, and a portion of a surface of the high concentration n-type semiconductor layer 113 other than a surface center region. Moreover, a cathode electrode 114 is formed so as to span the surface center region of the high concentration n-type semiconductor layer 113, which is not covered with the insulating film 116, and a portion of the insulating film 116. Further, an anode electrode 115 is formed so as to cover a surface of the high concentration n-type semiconductor substrate 110. Reference characters J11, J12 and J13 indicate an interface between the insulating film 116 and the low concentration n-type semiconductor layer 111, an interface between the insulating film 116 and the p-type semiconductor layer 112, and an interface between the insulating film 116 and the high concentration n-type semiconductor layer 113, respectively. Further, reference characters J14 and J15 indicate an interface between the low concentration n-type semiconductor layer 111 and the p-type semiconductor layer 112 and an interface between the high concentration n-type semiconductor layer 113 and the p-type semiconductor layer 112, respectively. This semiconductor device for surge protection has an effect of, when a surge voltage as high as a breakdown voltage is applied across the cathode electrode 114 and the anode electrode 115, causing a surge current that flows due to this surge voltage to flow to the anode electrode 115 side without flowing to an apparatus (not shown) side.

Patent Document 1: JP 2003-110119 A

However, the above-described semiconductor device for surge protection has presented a problem that, in the vicinity of an interface between the semiconductor substrate 100 made of silicon or the like and the insulating film 116 made of silicon oxide or the like, crystal defects are present that are attributable to a difference in crystal structure such as in inter-lattice distance between the semiconductor substrate 100 and the insulating film 116, resulting in the semiconductor device having low surge resistance (resistance to a surge voltage). That is, in the semiconductor device for surge protection, the interfaces J15 and J14 extend to reach the insulating film 116, which leads to the fear that, upon application of a surge voltage, a surge current may flow through the interfaces J11, J12 and J13 where surge resistance has been deteriorated due to crystal defects.

DISCLOSURE OF INVENTION

In order to solve the above-described problem with the conventional technique, the present invention provides a semiconductor device for surge protection having high surge resistance.

A first semiconductor device for surge protection according to the present invention includes: a semiconductor substrate; first and second electrodes that are formed respectively on both main surfaces of the semiconductor substrate; and an insulating film that is formed so as to cover a portion of the semiconductor substrate. The semiconductor substrate includes: a high concentration first conductivity type semiconductor substrate; a low concentration first conductivity type semiconductor layer that is formed on the high concentration first conductivity type semiconductor substrate; a high concentration first conductivity type semiconductor layer that extends from a surface of and into the low concentration first conductivity type semiconductor layer; a second conductivity type semiconductor layer that extends from a bottom surface of the high concentration first conductivity type semiconductor layer into the low concentration first conductivity type semiconductor layer so as to share an axis with the high concentration first conductivity type semiconductor layer; and a cylindrical low concentration second conductivity type semiconductor layer that extends from the surface of the low concentration first conductivity type semiconductor layer into the low concentration first conductivity type semiconductor layer so as to share an axis with the high concentration first conductivity type semiconductor layer, and has an interface with the high concentration first conductivity type semiconductor layer and an interface with the second conductivity type semiconductor layer. The insulating film is formed so as to cover the surface of the low concentration first conductivity type semiconductor layer, a surface of the low concentration second conductivity type semiconductor layer, and a portion of a surface of the high concentration first conductivity type semiconductor layer other than a surface center region. The first electrode is formed so as to span the surface center region of the high concentration first conductivity type semiconductor layer, which is not covered with the insulating film, and a portion of the insulating film. The second electrode is formed so as to cover a surface of the high concentration first conductivity type semiconductor substrate. The low concentration second conductivity type semiconductor layer has an impurity concentration lower than an impurity concentration of the second conductivity type semiconductor layer.

A second semiconductor device for surge protection according to the present invention includes: a semiconductor substrate; first and second electrodes that are formed respectively on both main surfaces of the semiconductor substrate; and an insulating film that is formed so as to cover a portion of the semiconductor substrate. The semiconductor substrate includes: a high concentration first conductivity type semiconductor substrate; a low concentration second conductivity type semiconductor layer that is formed on the high concentration first conductivity type semiconductor substrate; a high concentration first conductivity type semiconductor layer that extends from a surface of and into the low concentration second conductivity type semiconductor layer; and a second conductivity type semiconductor layer that extends from a bottom surface of the high concentration first conductivity type semiconductor layer into the low concentration second conductivity type semiconductor layer so as to share an axis with the high concentration first conductivity type semiconductor layer. The insulating film is formed so as to cover the surface of the low concentration second conductivity type semiconductor layer and a portion of a surface of the high concentration first conductivity type semiconductor layer other than a surface center region. The first electrode is formed so as to span the surface center region of the high concentration first conductivity type semiconductor layer, which is not covered with the insulating film, and a portion of the insulating film. The second electrode is formed so as to cover a surface of the high concentration first conductivity type semiconductor substrate. The low concentration second conductivity type semiconductor layer has an impurity concentration lower than an impurity concentration of the second conductivity type semiconductor layer.

A third semiconductor device for surge protection according to the present invention includes: a semiconductor substrate; first and second electrodes that are formed respectively on both main surfaces of the semiconductor substrate; and an insulating film that is formed so as to cover a portion of the semiconductor substrate. The semiconductor substrate includes: a high concentration first conductivity type semiconductor substrate; a low concentration first conductivity type semiconductor layer that is formed on the high concentration first conductivity type semiconductor substrate; a low concentration second conductivity type semiconductor layer that is formed on the low concentration first conductivity type semiconductor layer; a high concentration first conductivity type semiconductor layer that extends from a surface of and into the low concentration second conductivity type semiconductor layer; and a second conductivity type semiconductor layer that extends from a bottom surface of the high concentration first conductivity type semiconductor layer into the low concentration second conductivity type semiconductor layer so as to share an axis with the high concentration first conductivity type semiconductor layer. The insulating film is formed so as to cover the surface of the low concentration second conductivity type semiconductor layer and a portion of a surface of the high concentration first conductivity type semiconductor layer other than a surface center region. The first electrode is formed so as to span the surface center region of the high concentration first conductivity type semiconductor layer, which is not covered with the insulating film, and a portion of the insulating film. The second electrode is formed so as to cover a surface of the high concentration first conductivity type semiconductor substrate. The low concentration second conductivity type semiconductor layer has an impurity concentration lower than an impurity concentration of the second conductivity type semiconductor layer.

DESCRIPTION OF THE INVENTION

Hereinafter, the present invention will be described by way of embodiments with reference to the appended drawings. In each of the descriptions of the following embodiments, a n-type semiconductor, a p-type semiconductor, a cathode electrode, and an anode electrode are assumed to correspond to a first conductivity type semiconductor, a second conductivity type semiconductor, a first electrode, and a second electrode, respectively.

Embodiment 1

Figure 1:
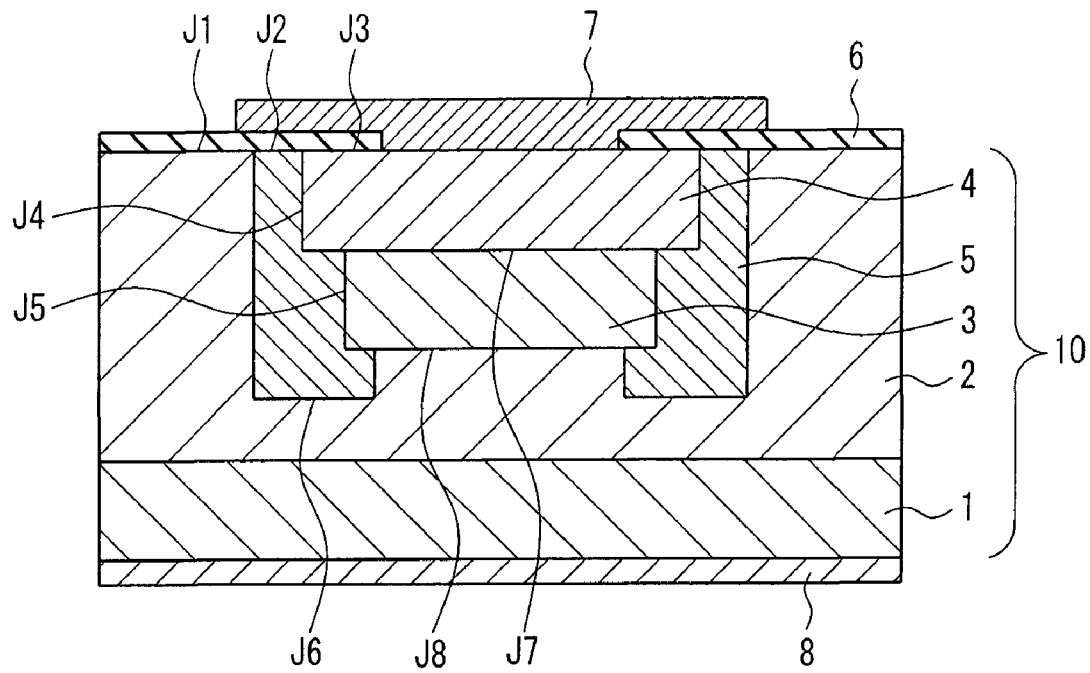
FIG. 1 is a cross-sectional view of a semiconductor device for surge protection according to Embodiment 1 of the present invention.

FIG. 1 is a cross-sectional view of a semiconductor device for surge protection according to Embodiment 1 of the present invention. As shown in FIG. 1, the semiconductor device for surge protection according to Embodiment 1 includes a semiconductor substrate 10, a cathode electrode 7 and an anode electrode 8 that are formed respectively on both main surfaces of the semiconductor substrate 10, and an insulating film 6 that is formed so as to cover a portion of the semiconductor substrate 10.

The semiconductor substrate 10 includes a high concentration n-type semiconductor substrate 1, a low concentration n-type semiconductor layer 2 that is formed on the high concentration n-type semiconductor substrate 1, a high concentration n-type semiconductor layer 4 that extends from a surface of and into the low concentration n-type semiconductor layer 2, a p-type semiconductor layer 3 that extends from a bottom surface of the high concentration n-type semiconductor layer 4 into the low concentration n-type semiconductor layer 2 so as to share an axis with the high concentration n-type semiconductor layer 4, and a cylindrical low concentration p-type semiconductor layer 5 that extends from the surface of the low concentration n-type semiconductor layer 2 into the low concentration n-type semiconductor layer 2 so as to share an axis with the high concentration n-type semiconductor layer 4, and has an interface J4 with the high concentration n-type semiconductor layer 4 and an interface J5 with the p-type semiconductor layer 3.

The insulating film 6 is formed so as to cover the surface of the low concentration n-type semiconductor layer 2, a surface of the low concentration p-type semiconductor layer 5, and a portion of a surface of the high concentration n-type semiconductor layer 4 other than a surface center region. Further, the cathode electrode 7 is formed so as to span the surface center region of the high concentration n-type semiconductor layer 4, which is not covered with the insulating film 6, and a portion of the insulating film 6, and the anode electrode 8 is formed so as to cover a surface of the high concentration n-type semiconductor substrate 1. Reference characters J1, J2 and J3 indicate an interface between the low concentration n-type semiconductor layer 2 and the insulating film 6, an interface between the low concentration p-type semiconductor layer 5 and the insulating film 6, and an interface between the high concentration n-type semiconductor layer 4 and the insulating film 6, respectively. Further, reference characters J6, J7 and J8 indicate an interface between the low concentration p-type semiconductor layer 5 and the low concentration n-type semiconductor layer 2, an interface between the high concentration n-type semiconductor layer 4 and the p-type semiconductor layer 3, and an interface between the p-type semiconductor layer 3 and the low concentration n-type semiconductor layer 2, respectively.

In the above-described configuration, as the high concentration n-type semiconductor substrate 1, for example, a single-crystal silicon substrate can be used that has a thickness of about 400 µm and a concentration of an impurity such as phosphorus of about $10^{18}$ to $10^{21}$ cm$^{-3}$. As the low concentration n-type semiconductor layer 2, for example, a silicon material layer can be used that is obtained by epitaxial growth and has a thickness of about 50 µm. Further, the concentration of an impurity such as phosphorus contained in the low concentration n-type semiconductor layer 2 is set to be lower than an impurity concentration of the high concentration n-type semiconductor substrate 1, for example, to be about $10^{13}$ to $10^{16}$ cm$^{-3}$. As the p-type semiconductor layer 3, for example, a single-crystal silicon layer can be used that has a thickness of about 20 µm and a concentration of an impurity such as boron of about $10^{18}$ to $10^{20}$ cm$^{-3}$. As the high concentration n-type semiconductor layer 4, for example, a single-crystal silicon material layer having a thickness of about 10 µm can be used. Further, the concentration of an impurity such as phosphorus contained in the high concentration n-type semiconductor layer 4 is set to be higher than an impurity concentration of the low concentration n-type semiconductor layer 2, for example, to be about $10^{18}$ to $10^{20}$ cm$^{-3}$. As the low concentration p-type semiconductor layer 5, for example, a single-crystal silicon layer having a thickness of about 30 µm can be used. Further, the concentration of an impurity such as boron contained in the low concentration p-type semiconductor layer 5 is set to be lower than an impurity concentration of the p-type semiconductor layer 3, for example, to be about $10^{14}$ to $10^{17}$ cm$^{-3}$. As the insulating film 6, for example, a silicon oxide film having a thickness of about 2 µm can be used. As a material for the cathode electrode 7 and the anode electrode 8, metal such as copper or gold that is an electrode material in general use can be used.

According to this configuration, the interface J7 between the high concentration n-type semiconductor layer 4 and the p-type semiconductor layer 3 and the interface J8 between the p-type semiconductor layer 3 and the low concentration n-type semiconductor layer 2 form main junction portions. Further, the interface J4 between the high concentration n-type semiconductor layer 4 and the low concentration p-type semiconductor layer 5 and the interface J6 between the low concentration p-type semiconductor layer 5 and the low concentration n-type semiconductor layer 2 form sub junction portions. Further, since the low concentration p-type semiconductor layer 5 has an impurity concentration lower than an impurity concentration of the p-type semiconductor layer 3 as described above, the breakdown voltage of the interfaces J4 and J6 as the sub-junction portions is high compared with that of the interfaces J7 and J8 as the main junction portions. Because of this, when a surge voltage is applied across the cathode electrode 7 and the anode electrode 8, a surge current flows only through the interfaces J7 and J8 as the main junction portions without passing through the interfaces J4 and J6 as the sub-junction portions. Thus, a surge current does not flow in the vicinity of an interface between the semiconductor substrate 10 and the insulating film 6, thereby allowing a semiconductor device for surge protection to have improved surge resistance.

In this embodiment, the p-type semiconductor layer 3 and the low concentration p-type semiconductor layer 5 were formed so as to extend into but not beyond the low concentration n-type semiconductor layer 2. However, the p-type semiconductor layer 3 and the low concentration p-type semiconductor layer 5 also may be formed so as to extend further into the high concentration n-type semiconductor substrate 1.

Furthermore, in order to prevent the deterioration of properties caused by a depletion layer spreading to reach a side surface of the semiconductor substrate 10, a high concentration n-type semiconductor layer may be provided separately as a channel stopper on an outer peripheral edge of the main surface of the semiconductor substrate 10 on the cathode electrode 7 side.

Embodiment 2

Figure 2:
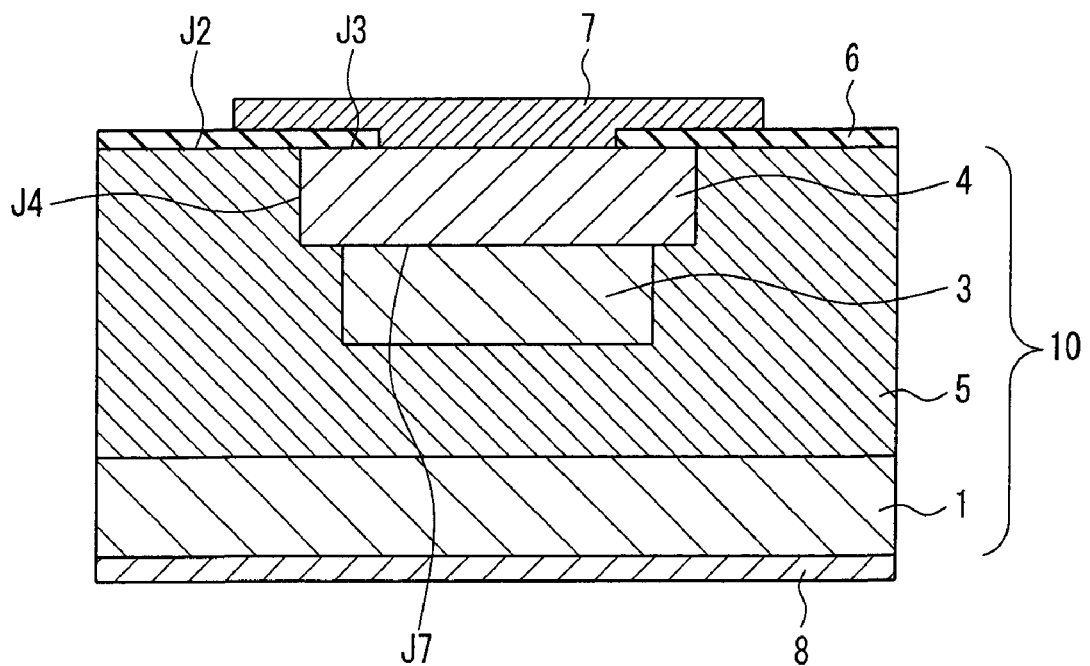
FIG. 2 is a cross-sectional view of a semiconductor device for surge protection according to Embodiment 2 of the present invention.

The description is directed next to a semiconductor device for surge protection according to Embodiment 2 of the present invention. FIG. 2 is a cross-sectional view of the semiconductor device for surge protection according to Embodiment 2 of the present invention. In FIG. 2, constituent elements identical to those shown in FIG. 1 are assigned the same reference characters, and duplicate descriptions thereof may be omitted.

As shown in FIG. 2, the semiconductor device for surge protection according to Embodiment 2 includes a semiconductor substrate 10, a cathode electrode 7 and an anode electrode 8 that are formed respectively on both main surfaces of the semiconductor substrate 10, and an insulating film 6 that is formed so as to cover a portion of the semiconductor substrate 10.

The semiconductor substrate 10 includes a high concentration n-type semiconductor substrate 1, a low concentration p-type semiconductor layer 5 that is formed on the high concentration n-type semiconductor 1, a high concentration n-type semiconductor layer 4 that extends from a surface of and into the low concentration p-type semiconductor layer 5, and a p-type semiconductor layer 3 that extends from a bottom surface of the high concentration n-type semiconductor layer 4 into the low concentration p-type semiconductor layer 5 so as to share an axis with the high concentration n-type semiconductor layer 4.

The insulating film 6 is formed so as to cover the surface of the low concentration p-type semiconductor layer 5 and a portion of a surface of the high concentration n-type semiconductor layer 4 other than a surface center region. Further, the cathode electrode 7 is formed so as to span the surface center region of the high concentration n-type semiconductor layer 4, which is not covered with the insulating film 6, and a portion of the insulating film 6, and the anode electrode 8 is formed so as to cover a surface of the high concentration semiconductor substrate 1. Further, the low concentration p-type semiconductor layer 5 has an impurity concentration lower than an impurity concentration of the p-type semiconductor layer 3.

According to this configuration, an interface J7 between the high concentration n-type semiconductor layer 4 and the p-type semiconductor layer 3 forms a main junction portion. Further, an interface J4 between the high concentration n-type semiconductor layer 4 and the low concentration p-type semiconductor layer 5 forms a sub-junction portion. Since the low concentration p-type semiconductor layer 5 has an impurity concentration lower than an impurity concentration of the p-type semiconductor layer 3 as described above, the breakdown voltage of the interface J4 as the sub-junction portion is high compared with that of the interface J7 as the main junction portion. Because of this, when a surge voltage is applied across the cathode electrode 7 and the anode electrode 8, a surge current flows only though the interface J7 as the main junction portion without passing through the interface J4 as the sub-junction portion. Thus, a surge current does not flow in the vicinity of an interface between the semiconductor substrate 10 and the insulating film 6, thereby allowing a semiconductor device for surge protection to have improved surge resistance.

In this embodiment, the p-type semiconductor layer 3 was formed so as to extend into but not beyond the low concentration p-type semiconductor layer 5. However, the p-type semiconductor layer 3 also may be formed so as to extend further into the high concentration n-type semiconductor substrate 1.

In addition, in the case where a plurality of semiconductor devices for surge protection as described above are arranged in parallel, in order to secure channel isolation between the semiconductor devices for surge protection, a high concentration n-type semiconductor layer may be provided separately as a partition between each pair of adjacent ones of the semiconductor devices for surge protection.

Embodiment 3

Figure 3:
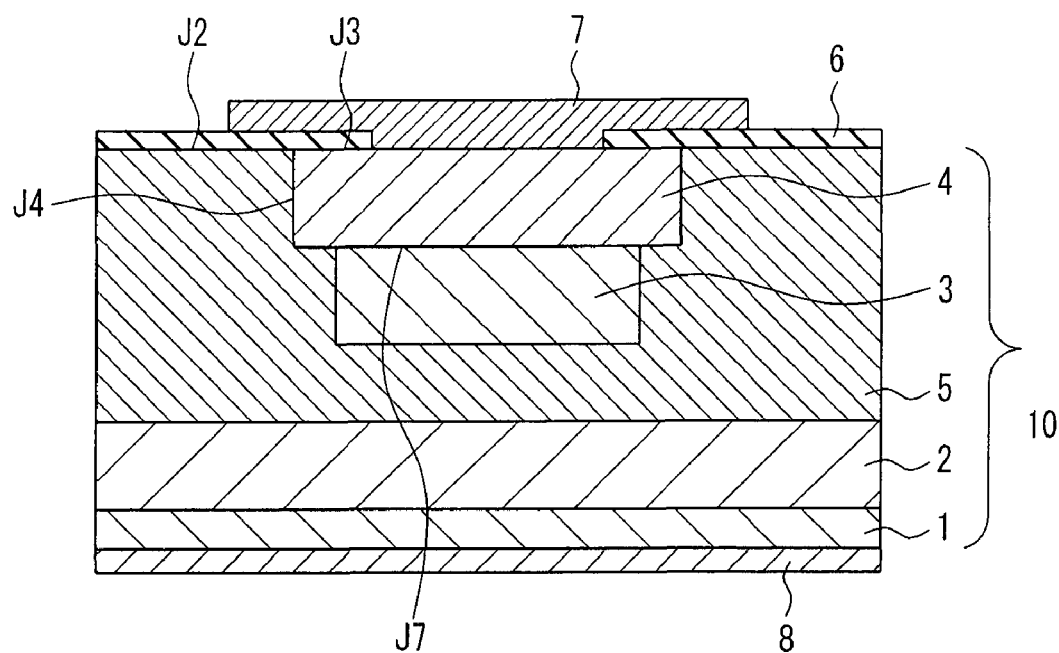
FIG. 3 is a cross-sectional view of a semiconductor device for surge protection according to Embodiment 3 of the present invention.
Figure 4:
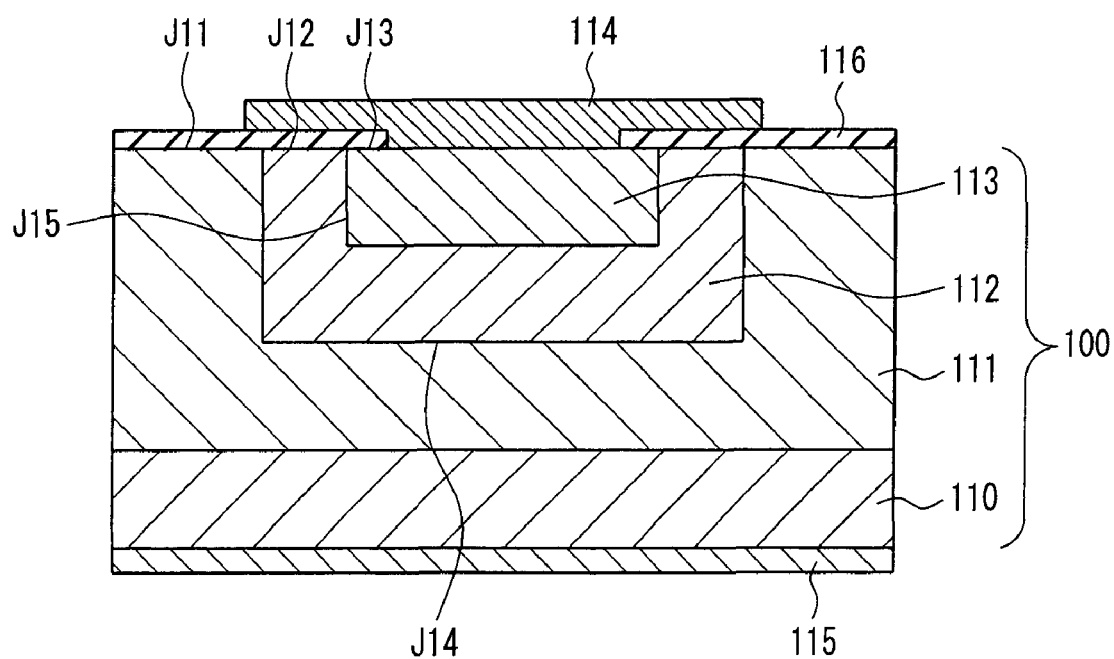
FIG. 4 is a cross-sectional view of a conventional semiconductor device for surge protection.

The description is directed next to a semiconductor device for surge protection according to Embodiment 3 of the present invention. FIG. 3 is a cross-sectional view of the semiconductor device for surge protection according to Embodiment 3 of the present invention. In FIG. 3, constituent elements identical to those shown in FIGS. 1 and 2 are assigned the same reference characters, and duplicate descriptions thereof may be omitted.

As shown in FIG. 3, the semiconductor device for surge protection according to Embodiment 3 is different from the above-described semiconductor device for surge protection according to Embodiment 2 (see FIG. 2) only in the configuration of the semiconductor substrate 10. In the semiconductor device for surge protection according to Embodiment 3, a low concentration n-type semiconductor layer 2 is interposed between a high concentration n-type semiconductor substrate 1 and a low concentration p-type semiconductor layer 5. This allows the high concentration n-type semiconductor substrate 1 to be in ohmic contact with an anode electrode 8 without depending on an impurity concentration of the low concentration n-type semiconductor layer 2. Therefore, even in the case where the impurity concentration of the low concentration n-type semiconductor layer 2 is lowered, the surge resistance of the semiconductor device for surge protection is not deteriorated, and thus it is possible to reduce the parasitic capacitance of the semiconductor device for surge protection by lowering the impurity concentration of the low concentration n-type semiconductor layer 2. For example, the high concentration n-type semiconductor substrate 1 may have an impurity concentration of about $10^{18}$ to $10^{21}$ cm$^{-3}$, and the low concentration n-type semiconductor layer 2 may have an impurity concentration of about $10^{13}$ to $10^{16}$ cm$^{-3}$. Other configurations are the same as in the above-described semiconductor device for surge protection according to Embodiment 2. Accordingly, the semiconductor device for surge protection according to Embodiment 3 also can achieve the same effect as that of the semiconductor device for surge protection according to Embodiment 2.

The foregoing described the embodiments of the present invention, though the present invention is not limited thereto. For example, in each of the above descriptions of Embodiments 1 to 3, the n-type semiconductor and the p-type semiconductor were assumed to correspond to a first conductivity type semiconductor and a second conductivity type semiconductor, respectively. However, it also is possible that the p-type semiconductor and the n-type semiconductor are assumed to correspond to a first conductivity type semiconductor and a second conductivity type semiconductor, respectively. In that case, anode and cathode electrodes are inverted.

Industrial Applicability

The present invention is useful as a reference voltage circuit and a protection circuit, and is particularly useful for a circuit requiring surge resistance.

The inventon claimed is:
1. A semiconductor device for surge protection, comprising:
 a semiconductor substrate;
 first and second electrodes that are formed respectively on both main surfaces of the semiconductor substrate; and
 an insulating film that is formed so as to cover a portion of the semiconductor substrate,
 wherein the semiconductor substrate comprises:
 a high concentration first conductivity type semiconductor substrate;
 a low concentration first conductivity type semiconductor layer that is formed on the high concentration first conductivity type semiconductor substrate;
 a high concentration first conductivity type semiconductor layer that extends from a surface of and into the low concentration first conductivity type semiconductor layer;
 a second conductivity type semiconductor layer that extends from a bottom surface of the high concentration first conductivity type semiconductor layer into the low concentration first conductivity type semiconductor layer so as to share an axis with the high concentration first conductivity type semiconductor layer; and
 a cylindrical low concentration second conductivity type semiconductor layer that extends from the surface of the low concentration first conductivity type semiconductor layer into the low concentration first conductivity type semiconductor layer so as to share an axis with the high concentration first conductivity type semiconductor layer, and has an interface with the high concentration first conductivity type semiconductor layer and an interface with the second conductivity type semiconductor layer,
 the insulating film is formed so as to cover the surface of the low concentration first conductivity type semiconductor layer, a surface of the low concentration second conductivity type semiconductor layer, and a portion of a surface of the high concentration first conductivity type semiconductor layer other than a surface center region,
 the first electrode is formed so as to span the surface center region of the high concentration first conductivity type semiconductor layer, which is not covered with the insulating film, and a portion of the insulating film,
 the second electrode is formed so as to cover a surface of the high concentration first conductivity type semiconductor substrate, and
 the low concentration second conductivity type semiconductor layer has an impurity concentration lower than an impurity concentration of the second conductivity type semiconductor layer.

2. A semiconductor device for surge protection, comprising:
 a semiconductor substrate;
 first and second electrodes that are formed respectively on both main surfaces of the semiconductor substrate; and
 an insulating film that is formed so as to cover a portion of the semiconductor substrate, wherein the semiconductor substrate comprises:
a high concentration first conductivity type semiconductor substrate;
a low concentration first conductivity type semiconductor layer that is formed on the high concentration first conductivity type semiconductor substrate;
a low concentration second conductivity type semiconductor layer that is formed on the low concentration first conductivity type semiconductor layer,
a high concentration first conductivity type semiconductor layer that extends from a surface of and into the low concentration second conductivity type semiconductor layer; and
a second conductivity type semiconductor layer that extends from a bottom surface of the high concentration first conductivity type semiconductor layer into the low concentration second conductivity type semiconductor layer so as to share an axis with the high concentration first conductivity type semiconductor layer, the insulating film is formed so as to cover the surface of the low concentration second conductivity type semiconductor layer and a portion of a surface of the high concentration first conductivity type semiconductor layer other than a surface center region,
the first electrode is formed so as to span the surface center region of the high concentration first conductivity type semiconductor layer, which is not covered with the insulating film, and a portion of the insulating film,
the second electrode is formed so as to cover a surface of the high concentration first conductivity type semiconductor substrate, and
the low concentration second conductivity type semiconductor layer has an impurity concentration lower than an impurity concentration of the second conductivity type semiconductor layer.

* * * * *